United States Patent [19]
Muller et al.

[11] Patent Number: 5,818,108
[45] Date of Patent: Oct. 6, 1998

[54] HIGH-DENSITY, HIGHLY RELIABLE INTEGRATED CIRCUIT ASSEMBLY

[75] Inventors: Eric Muller, Fonsorbes; Marc Masgrangeas, Muret; Augustin Coello Vera, Pibrac, all of France

[73] Assignee: Alcatel N.V., Amsterdam

[21] Appl. No.: 837,091

[22] Filed: Apr. 14, 1997

Related U.S. Application Data

[63] Continuation of Ser. No. 253,554, Jun. 3, 1994, abandoned.

[30] Foreign Application Priority Data

Jun. 8, 1993 [FR] France .................................. 93 06840

[51] Int. Cl.$^6$ ................................................. H01L 23/34
[52] U.S. Cl. ........................................... 257/724; 257/723
[58] Field of Search .................................... 257/723, 724, 257/777, 686, 700, 728, 776; 361/728, 729, 803, 758

[56] References Cited

U.S. PATENT DOCUMENTS

| | | | |
|---|---|---|---|
| 4,730,232 | 3/1988 | Lindberg | 361/688 |
| 5,008,734 | 4/1991 | Dutta et al. | 257/700 |
| 5,061,990 | 10/1991 | Arakawa et al. | 257/676 |
| 5,241,456 | 8/1993 | Marcinkiewicz et al. | 257/686 |
| 5,299,094 | 3/1994 | Nishino et al. | 257/686 |
| 5,422,515 | 6/1995 | Endo | 257/691 |

FOREIGN PATENT DOCUMENTS

| | | |
|---|---|---|
| 0228953A1 | 7/1987 | European Pat. Off. . |
| 0434543A2 | 6/1991 | European Pat. Off. . |
| 2295570 | 7/1976 | France . |
| 2306530 | 10/1976 | France . |
| 55-115351 | 9/1980 | Japan . |
| 62-123745 | 6/1987 | Japan . |
| 63-136657 | 6/1988 | Japan . |

*Primary Examiner*—Jerome Jackson
*Assistant Examiner*—Nathan K. Kelly
*Attorney, Agent, or Firm*—Sughrue, Mion, Zinn, Macpeak & Seas, PLLC

[57] ABSTRACT

The invention concerns an MCM type high-density assembly of integrated circuits having a high reliability by virtue of its design and the means employed in its implementation. The essential feature of the assembly is the presence of one or more interconnection substrates in addition to at least one substrate carrying a plurality of unencapsulated electronic chips connected to the interconnection substrate(s) by conventional microwiring techniques, preferably through one or more apertures in the substrates. The interconnection substrate(s) is or are advantageously of the multilayer type. The assembly is adapted to be encapsulated thereafter in a hermetically sealed case in the manner that is standard for MCM. In various embodiments the unencapsulated chips can be attached to one or both sides of a supporting substrate, respectively in conjunction with the use of one or two interconnection substrates with apertures; a plurality of sets of two or three substrates formed in this way can be stacked either in one case or in separate cases designed to be stacked; the integrated circuits can be conventional two-dimensional chips or "3D" blocks of circuits integrated in three dimensions. The invention also concerns the method of implementation. Applications in the fields of space, the military and onboard or portable electronics of high processing power or high memory capacity.

17 Claims, 6 Drawing Sheets

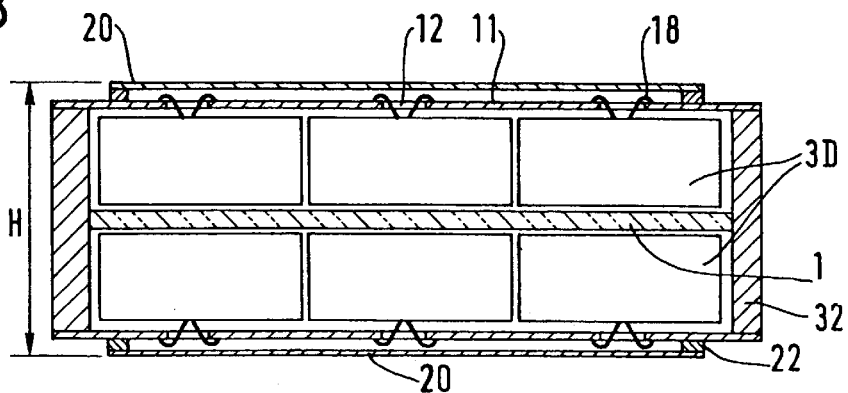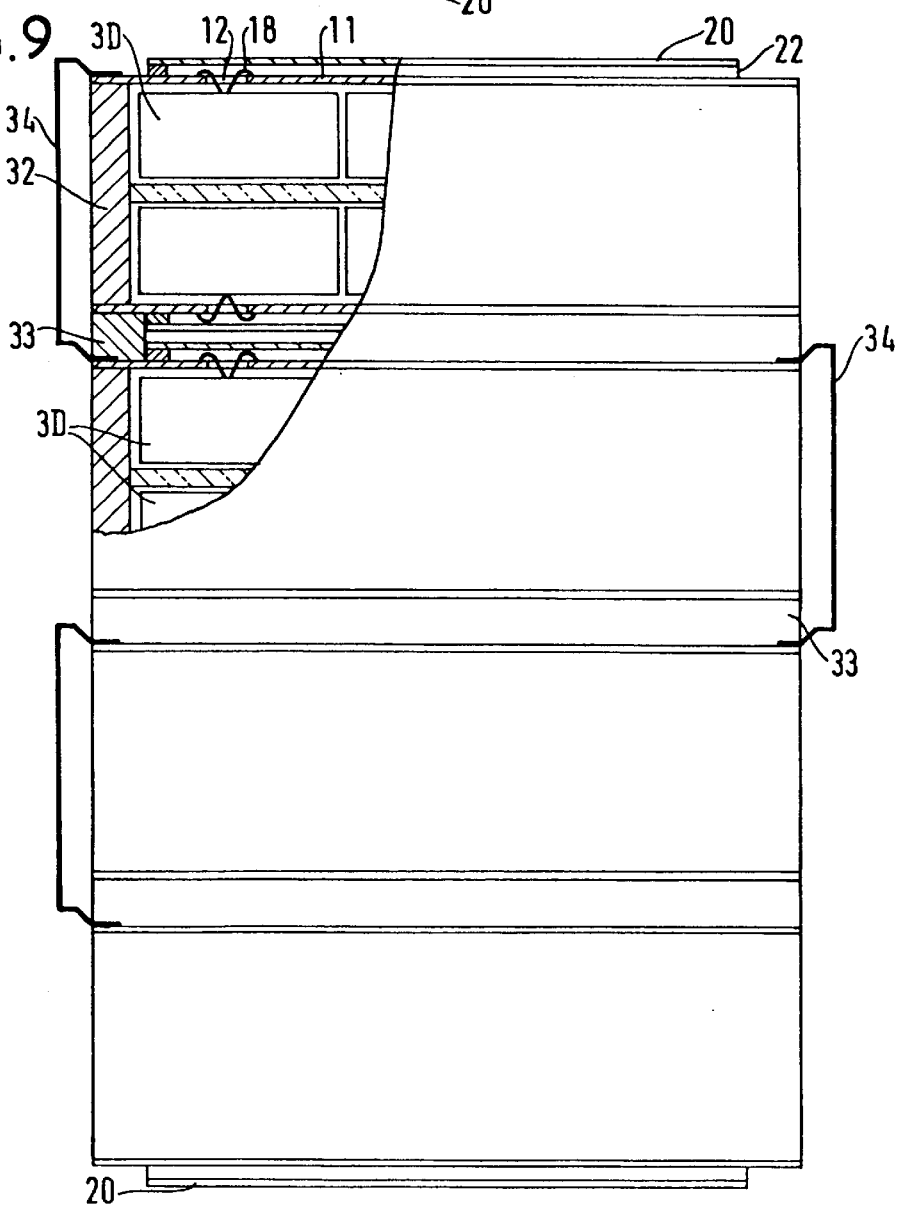

HIGH-DENSITY, HIGHLY RELIABLE INTEGRATED CIRCUIT ASSEMBLY

This is a continuation of application No. 08/253,554 filed Jun. 3, 1994 now abandoned.

The field of the invention is that of very large scale integration microelectronics.

BACKGROUND OF THE INVENTION

To be more specific, the invention concerns the production of circuits in multichip modules (MCM) including integrated circuits. There is currently a trend in this field towards miniaturization not only of the individual components but also of the circuits including them. The invention is more particularly concerned with MCM circuits comprising a large number of components. These components can be LSI integrated circuits, for example.

The general problem addressed by the invention, arising out of very large scale integration, can be stated in two ways: it is either to reduce the size of the printed circuits and the equipment including them without compromising performance or to increase the capabilities and to improve the performance of electronic equipment without increasing the size of the circuits.

In some application areas, and especially in military and space applications, this trend is accompanied by a constant preoccupation with reliability. The solutions adopted must therefore simultaneously meet the requirement for improved performance and offer maximum reliability, even under very severe environmental conditions (vibration, moisture, impact, etc).

The increase in the number of components that can be integrated onto a two-dimensional support is reaching an upper limit with minimum line widths on semiconductor substrates in the order of a few tenths of a micrometer. Further increase must therefore be in the third dimension. The technologies of the multichip module (MCM) and stacked integrated circuits using multiple supports are state of the art solutions yet to be applied on a large scale.

These technologies have yet to be adopted for military and space applications as they have yet to be proven for use in severe environments. An object of the invention is to provide a technology that can meet the requirements of these applications while allowing three-dimensional integration of integrated circuits; in other words, an object of the invention is to achieve the very large scale integration possible by moving into the third dimension without compromising the very high reliability in hostile environments required for these applications.

One problem encountered in assembling MCM for high-density, highly reliable applications is that of interconnecting a large number of "chips", each having hundreds of input/output connections, without compromising the scale of integration or the reliability of the integrated assembly.

For example, a state of the art MCM can include around ten unencapsulated chips (3, 4) on an insulative substrate (1) mounted on a metal frame (2), as shown in FIG. 1. The chips have different functions: computation (4), memory (3), etc. Each chip can have several tens of input/output connections, for example. In state of the art implementations the substrate (1) constitutes a mechanical support for the chips and includes interconnecting tracks (not shown) or printed circuits for connecting the chips to each other and to the outside world. Given the large number of connections required, the substrate can be a "co-sintered" substrate, for example, including multiple levels of interconnecting conductive tracks photo-etched onto thin insulative films which are stacked and heated together (hence "cosintered") to form an integrated structure.

When the assembly is complete it is enclosed in a hermetically sealed case comprising, for example, two covers (not shown in this figure) placed on two sides of a metal frame (2) around the substrate (1) and the unencapsulated chips (4, 3) thereon.

In the prior art the chip inputs and outputs are connected to a printed circuit of this kind (on the multilevel interconnection substrate) by microwired connections as shown in FIG. 2. In this prior art design the chips (3, 4) are mechanically attached to the substrate (1) which includes the etched interconnection tracks (not shown). The chips (3, 4) have input/output connection lands, usually on their top surface as their bottom surface is fixed to the substrate (1). The interconnection lands (5) can be at the perimeter of the chip (4), which is a microprocessor, for example, or the lands (6) can be in the middle of the chip (3), which is a very high capacity DRAM, for example.

The prior art microwired connections use electrically conductive wires (7, 8) between the interconnection lands (5, 6) on the chips (3, 4) and the multilevel interconnection substrate (1). FIG. 2 shows that the wires (8) of the microwired connections between the lands (5) at the perimeter of the chip (4) and the substrate (1) are much shorter than the wires (7) of the microwired connections between the lands (6) in the middle of the chip (3) and the same substrate (1). In other words, in the prior art, using chips (3) with their input/output connection lands (6) in the middle of the chip requires the use of microwires (7) much longer than the microwires (8) used for the microwired connections of the chips (4) whose input/output connection lands (5) are on their perimeter.

Hence, a problem in highly reliable applications. In space applications, for example, the payload is exposed to very high levels of vibration during launch and orbital injection. The reliability of microwiring using long wires (7) in these hostile environments has yet to be proven. Pending this, the use of long wires (7) is ruled out which in turn rules out the use for space applications of chips (3) whose interconnection lands (6) are in the middle of the chip in prior art MCM.

There will shortly be coming onto the market semiconductors (very high capacity RAM) available only with the input/output connections in the middle of the chip. These memories will not be immediately usable in an MCM assembly for use on a satellite because of reservations as to the reliability of the microwired connections.

OBJECTS AND SUMMARY OF THE INVENTION

One object of the invention is to alleviate these problems of the prior art.

To this end the invention proposes a high-density and highly reliable multiple integrated circuit assembly (MCM) comprising at least one substrate (1) having two substantially parallel plane sides, a plurality of integrated circuits (3, 4) disposed on at least one side of said substrate (1), a frame (2) comprising one or more parts disposed at the perimeter of said substrate (1) and around said integrated circuits (3, 4), said integrated circuits (3, 4) further including input and output interconnection lands (5, 6) connected by microwired connections to circuits printed on a substrate, wherein said assembly further comprises at least one dedicated interconnection substrate (11) for said microwired connections separate from and parallel to said substrate (1) carrying said integrated circuits (3, 4) at a distance therefrom greater than the height of said integrated circuits (3, 4) on said substrate (1) and wherein at least some of said interconnection lands (5, 6) of said integrated circuits (3, 4) are connected to one side of said dedicated interconnection substrate (11) by microwired connections. (see FIG. 3 for one example of the layout of the apertures 12 on the substrate 11.)

Said interconnection substrate(s) (11) advantageously include(s) apertures (12) whose size and location provide access to the interconnection lands (5, 6) on the chips (3, 4) through said interconnection substrate (11). The interconnection substrate(s) (11) is/are advantageously a multilayer substrate. In a preferred embodiment of the invention the chips are microwired using conductive wires (18) which pass through the apertures (12) of said interconnection substrate (11) to connect said lands (5, 6) to the surface of said interconnection substrate farthest from said integrated circuits. This surface has the easiest access, which facilitates the microwiring operation.

According to one feature of the invention, said interconnection lands (5) are on the perimeter of the chip (4). According to another feature of the invention said interconnection lands (6) are at the center of the chips (3). According to another feature of the invention the lands are at the perimeter or at the center of the chips.

According to one feature of the invention all the input/output interconnection lands (5, 6) of all the chips (3, 4) are connected by microwired connections to an interconnection substrate (11) separate from the substrate (1) carrying the chips (3, 4). According to another feature of the invention some only of the input/output interconnection lands (5, 6) are connected by microwired connections to an interconnection substrate (11) separate from the substrate (1) carrying the chips (3, 4), the remainder being connected to the substrate (1) carrying the chips (3, 4), as in the prior art. The structure according to the invention is compatible with all prior art structures and enables the production of a hybrid device using the prior art solution in conjunction with the solution of the invention.

According to one feature of the invention integrated circuits (3, 4) are mounted on both sides of said substrate (1) mechanically supporting the chips and there are two interconnection substrates (11), one on each side of said supporting substrate (1). According to another feature of the invention a plurality of supporting substrates (1) can be stacked and each served by one or two interconnection substrates (11) disposed on one or both sides of the supporting substrate (1) of the device.

According to one feature of the invention the integrated circuits are conventional two-dimensional integrated circuits. According to another feature of the invention at least some of said integrated circuits are three-dimensional (3D) integrated circuits. In another embodiment all the integrated circuits are three-dimensional (3D) integrated circuits.

The invention also proposes a method of manufacturing the various embodiments of the invention briefly described above.

BRIEF DESCRIPTION OF THE DRAWINGS

Other features and advantages of the invention emerge from the following detailed description and the appended drawings, in which:

FIG. 8 shows one embodiment of a specific configuration of assembly according to the invention in diagrammatic cross-section, with the two-dimensional (2D) chips or integrated circuits from the previous embodiments replaced with three-dimensional (3D) integrated circuits;

FIG. 9 shows one embodiment of a stack of cases comprising 3D integrated circuits according to FIG. 8 in diagrammatic partial cross-section;

MORE DETAILED DESCRIPTION

In all the figures, which are provided by way of non-limiting example, the same reference numbers denote the same components. Some parts of the description, relating to components appearing in more than one figure, are not repeated in the detailed description of each figure.

Figure 1:
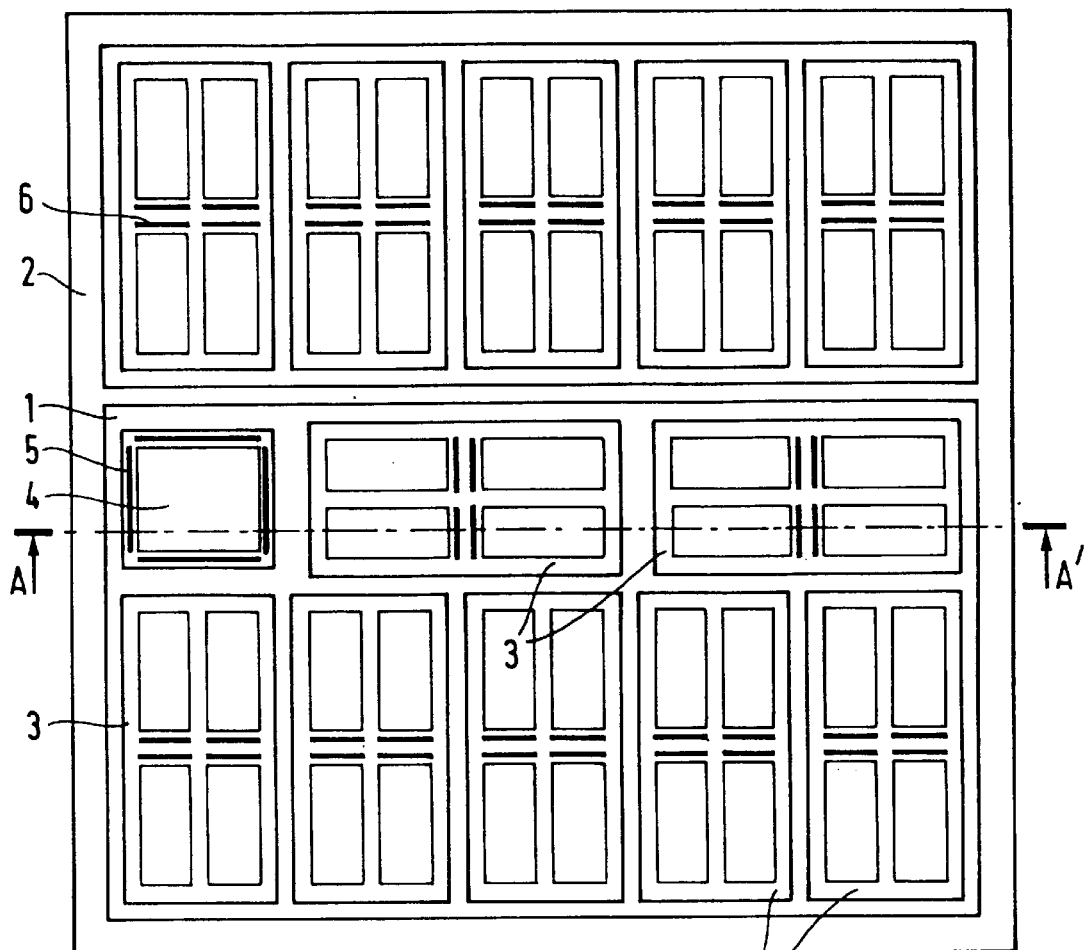
FIG. 1, already described, shows a prior art multichip module (MCM) in partially cutaway diagrammatic plan view.

FIG. 1, already described, shows one possible configuration for an MCM. The microwiring is not shown in this figure, which accordingly applies equally to the prior art and to the teaching of this patent application.

In addition to the items identified in this drawing and already mentioned in the discussion of the problem addressed by the invention, note that part of the frame (2) is not peripheral to the chips (3, 4). This part (which has no reference number) provides an electromagnetic screen and can mechanically strengthen the assembly in accordance with the invention.

Figure 2:
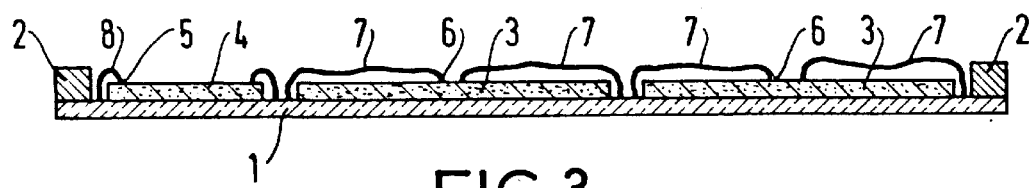
FIG. 2, already described, shows the prior art device from FIG. 1 in diagrammatic cross-section view on the line A–A'.

FIG. 2, already described, shows a prior art embodiment. This embodiment is implemented on only one side of the substrate (1) but its application to both sides of the same substrate to increase still further the scale of integration can easily be imagined.

Figure 3:
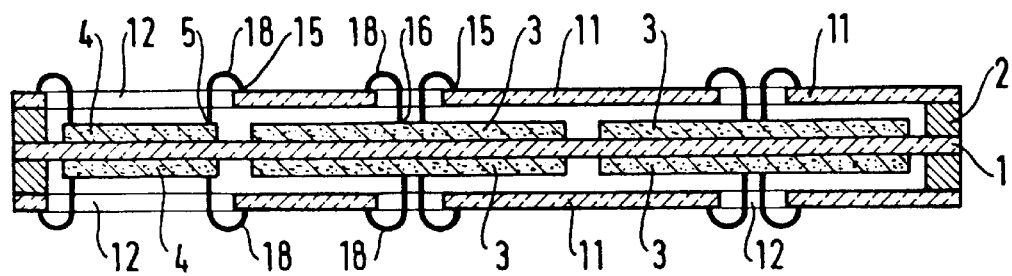
FIG. 3, already referred to, shows one embodiment of the device of the invention in diagrammatic cross-section view before it is hermetically sealed into its case.

FIG. 3 shows one embodiment of one feature of the invention. The embodiment shown includes two interconnection substrates (11) parallel to a first substrate (1) providing a mechanical support for integrated circuits (3, 4) (familiarly known as "chips") on both sides. The chips (3, 4) are fixed to the first substrate (1) by any appropriate known means, for example by gluing. The interconnection substrates (11) are held away from the first or supporting substrate (1) at a distance determined by the dimensions of the frames (2), which are advantageously made of metal, although this is not mandatory. The frames (2) and the substrates (1, 11) can be fixed together by any appropriate known means, for example by brazing or gluing. The distance between the substrates (1, 11) is not critical but must be at least slightly greater than the height of the chips (3, 4) mounted on the supporting substrate (1).

In the embodiment shown in FIG. 3 the interconnection substrates (11) have apertures (12) in them for the wires (18) of the microwired connections between the lands (5, 6) on the chips (3, 4) and the respective interconnection lands (15) on the outside surfaces of the interconnection substrates (11). This arrangement is advantageous in that it facilitates some stages of assembling MCM in accordance with the invention, to be described below (see the description of FIG. 10). The apertures facilitate simultaneous access to the lands on the chips and the lands on the interconnection substrates. The apertures could be dispensed with in a less advantageous embodiment of the invention, however.

Figure 4:
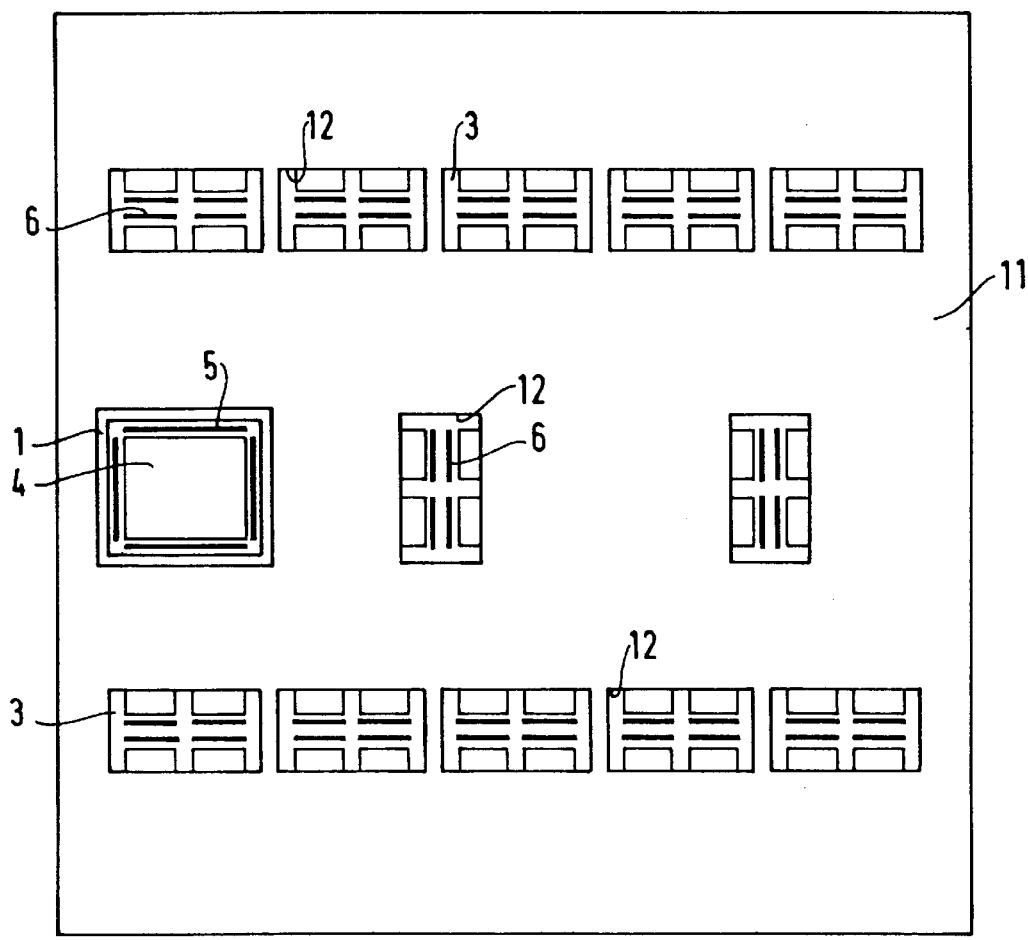
FIG. 4 shows the FIG. 3 embodiment in diagrammatic plan view, showing the microwiring apertures (12)
Figure 5:
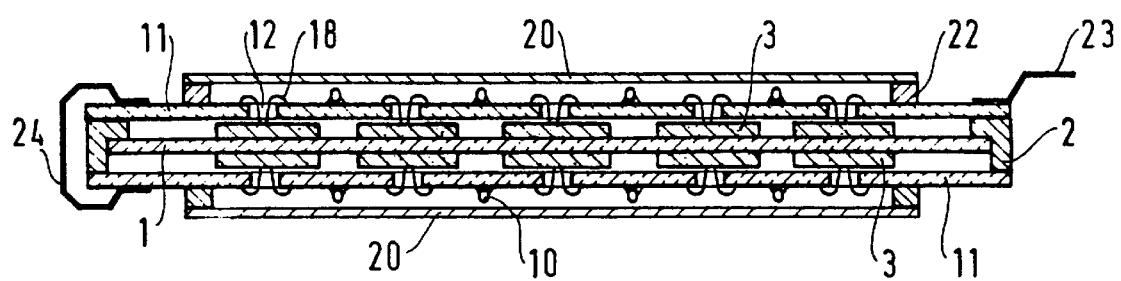
FIG. 5 shows one embodiment of a hermetically sealed case enclosing a device in accordance with the invention in diagrammatic cross-section, showing the connectors providing the interconnections between the two interconnection substrates and the connections between them and the outside world.

FIG. 4 shows a module in accordance with the invention from above before microwiring. The substrate (1) carries chips (3, 4) in a configuration similar to that of FIG. 1. The interconnection substrate (11) is on the top and so the chips (3, 4) and the mechanical support substrate (1) can be seen only through the apertures (12) for the microwiring. The apertures are located over interconnection lands (5, 6) on the integrated circuits (3, 4). The respective interconnection lands on the interconnection substrate (11) are not shown. They are disposed around each aperture in an embodiment as shown in this figure. FIG. 5 shows one embodiment of a device according to the invention enclosed in a hermetically sealed case. Inside the latter the mechanical support substrate (1) and the interconnection substrates (11) are spaced apart by the metal frame(s) (2). The support substrate (1) has chips (3) on both sides. The microwiring wires (18) pass through the apertures (12), which are holes in the substrates (11) of multilayer interconnection printed circuits. The various substrates are hermetically sealed to the frame(s) (2) by brazing, gluing or any other appropriate means. This figure also shows decoupling capacitors (10) for improved protection against unwanted coupling between the bare microwires (18).

To achieve the hermetic sealing of the MCM according to the invention it is sufficient to add one or more frames (22) at the perimeter(s) of the interconnection substrate(s) and hermetically sealed to the latter. A cover 20 is then applied to the frame(s) (22) and sealed by a known method. This hermetic sealing is currently necessary for conventional use of a device according to the invention but is not regarded as an essential feature of the invention.

According to one advantageous feature of the invention the interconnection printed circuits in the interconnection substrates (11) are interconnected by conductors (24) and connected to the outside world by conductors (23), these conductors being disposed parallel to each other in ribbon cables in standard implementations of prior art hermetically sealed cases.

Figure 6:
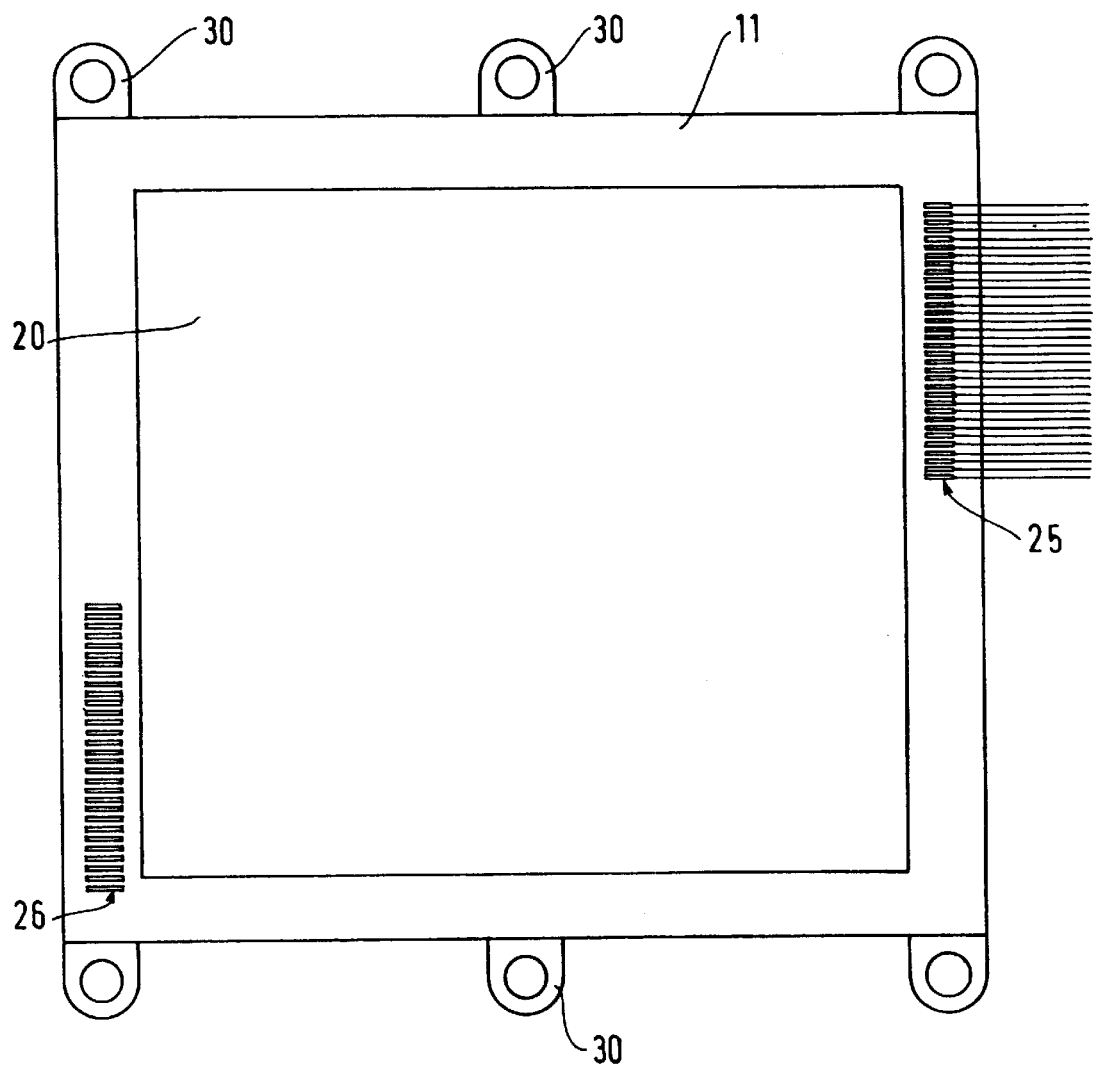
FIG. 6 shows the outside of one embodiment of a hermetically sealed case from FIG. 5 in plan view.

FIG. 6 shows one such hermetically sealed case enclosing a device according to the invention. From the outside there is nothing in particular to distinguish it from a standard case. The figure shows the cover (20) placed on the multilayer interconnection substrate (11) which has interconnection lands (26, 25) for the parallel conductor ribbon cables (24, 23) seen in FIG. 5. Fixing lugs (30) are used to fix the case mechanically into an equipment. These fixing lugs (30) are advantageously fixed to one of the frames (2) which form an integral part of the hermetically sealed case.

Figure 7:
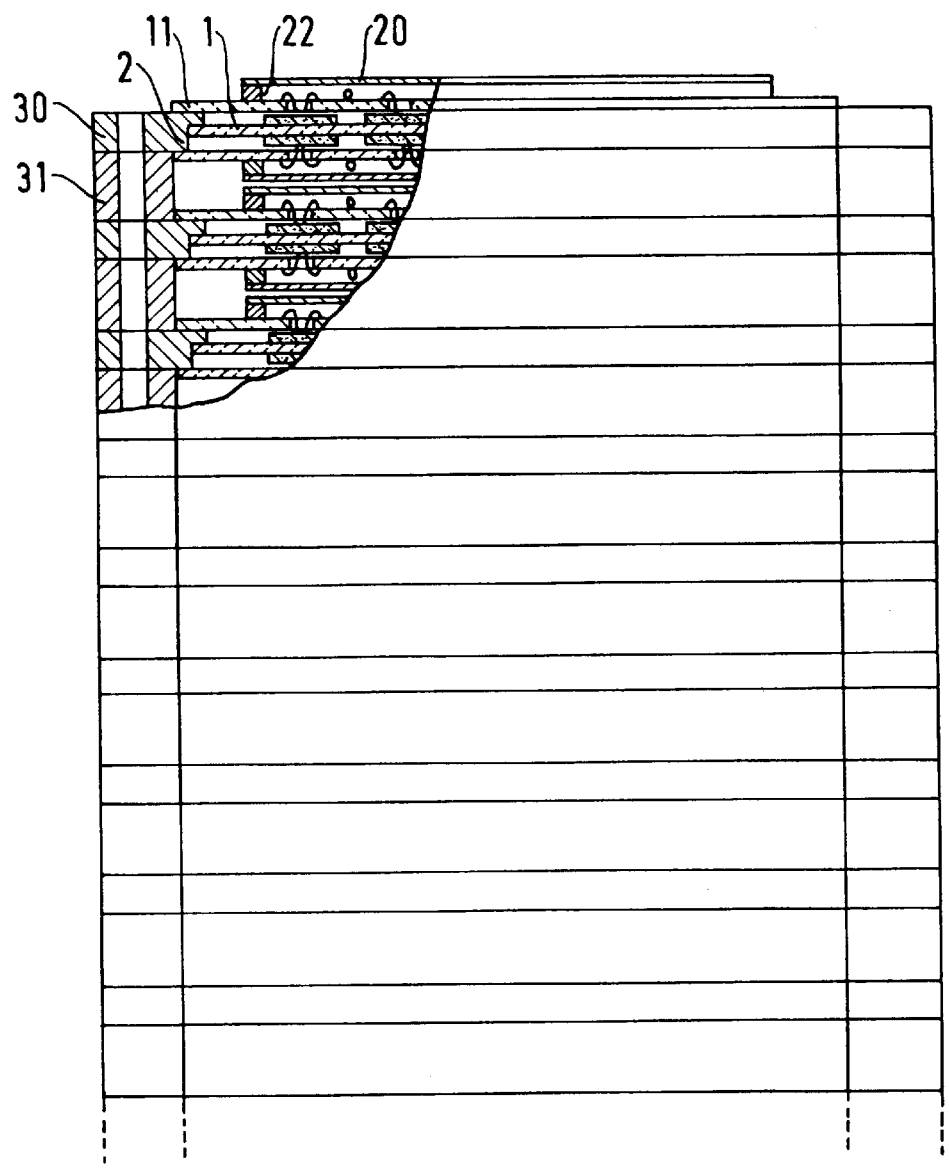
FIG. 7 show one embodiment of a stack of cases from FIG. 6 in diagrammatic partial cross-section.

FIG. 7 shows one embodiment of a stack of hermetically sealed cases as shown in FIG. 6. It is sufficient to add shims or spacers (31) of the appropriate thickness with holes in them in corresponding relationship to the fixing holes in the lugs (30), and a number of these cases can be fixed into an equipment using bolts of sufficient length. Thus the hermetically sealed case can be regarded as a modular unit of a three-dimensional structure of a high-density electronic device. This option is particularly attractive for equipments which can fail and which are easier to repair because of this modular construction.

Another option (not shown) would be to stack a number of devices according to the invention inside a single hermetically sealed case. The modular unit of an assembly of this kind would be as shown in FIG. 3, for example. With spacers between modular units as shown in FIG. 3 the numbers of mechanical substrates (1) and interconnection substrates (11) could be reduced. When the resulting structure has reached its optimum size the structure can be enclosed in a hermetically sealed case by the same standard methods already mentioned.

According to another feature of the invention shown in FIG. 8 three-dimensional (3D) integrated circuits are used instead of the two-dimensional (2D) integrated circuits shown in the previous figures. One example of a 3 integrated circuit of this kind is known from French patent application number 90 15473 filed Dec. 11, 1990 by Thomson-CSF, published under the number FR-A1-2 670 323. OThese 3 circuits have a parallelepiped, usually rectangular shape and therefore have six rectangular sides with interconnections lands (not shown) on at least one side. The invention can be used with advantage for the microwired connection of lands on the top of a 3 integrated circuit mounted on the top of the support substrate (1), or the lands on the bottom of a circuit mounted on the bottom of the support substrate.

In the embodiment shown in FIG. 8 the interconnection lands are on the top of a 3D integrated circuit mounted on the top of the support substrate (1) and are connected by microwires (18) to an interconnection substrate (11) including apertures (12) through which the microwires (18) pass to reach the top surface of the top interconnection substrate (11) or the bottom surface of the bottom interconnection substrate (11) of the device. The height H of the device is greater than in the case of 2D integrated circuits to make room for the 3D integrated circuits. The frame (32) is accordingly larger. Apart from this difference in size, the production of a device according to the invention is the same in the case of 2D and 3D integrated circuits.

The device according to the invention is then enclosed in a hermetically sealed case by fitting covers (20) to frames (22) on the interconnection substrates (11), as in the embodiments shown in the previous figures.

FIG. 9 shows one example of the stack of hermetically sealed cases containing devices according to the invention carrying 3D integrated circuits. The features are as in FIG. 7, applied to the cases from FIG. 8. Ribbon cables with parallel conductors interconnect the cases. The cases are held apart by spacers (33) of the appropriate size. All the other features identified in this drawing have already been described in relation to previous figures.

The previous figures show that the invention lends itself to a very large number of different configurations in each of which the length of the microwired connections of the integrated circuits in an MCM is minimized. This gives excellent and predictable resistance to vibration, acceleration and impact, meeting the requirements of the space and military application areas.

Figure 10:
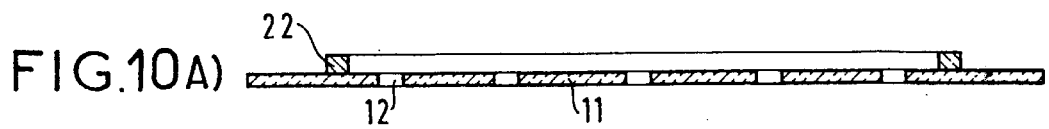
FIG. 10 is a diagram showing the successive stages of a method of manufacturing MCM encapsulations according to the invention and its main variants.
Figure 10:
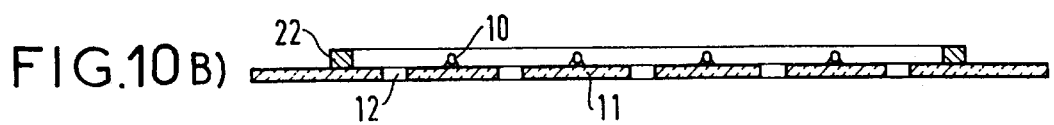
Figure 10:
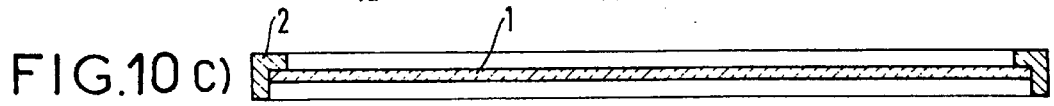
Figure 10:
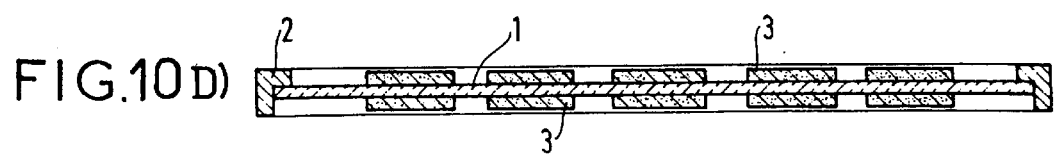
Figure 10:
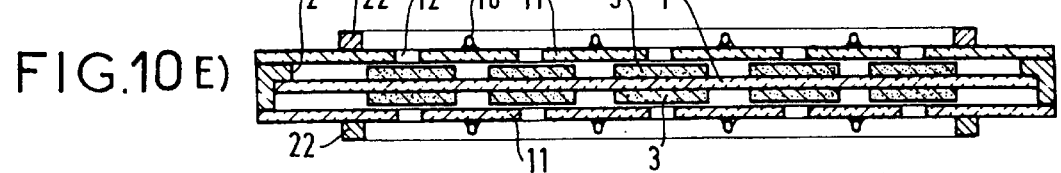
Figure 10:
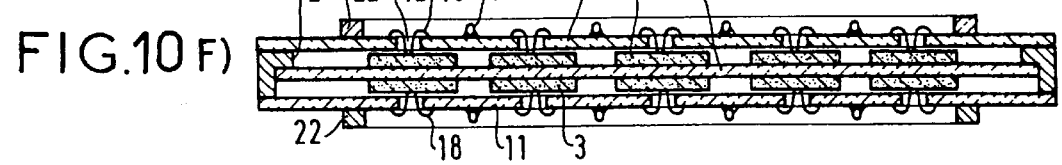
Figure 10:
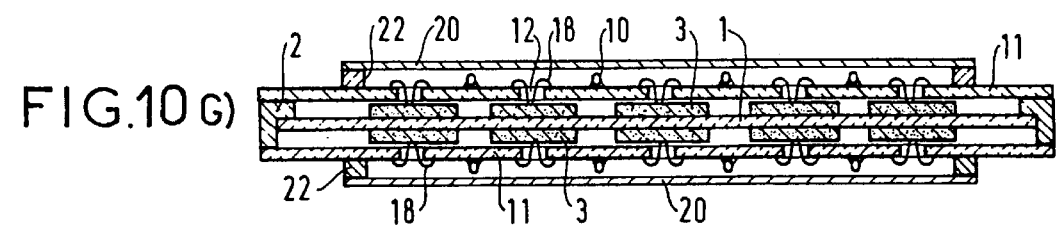
Figure 10:
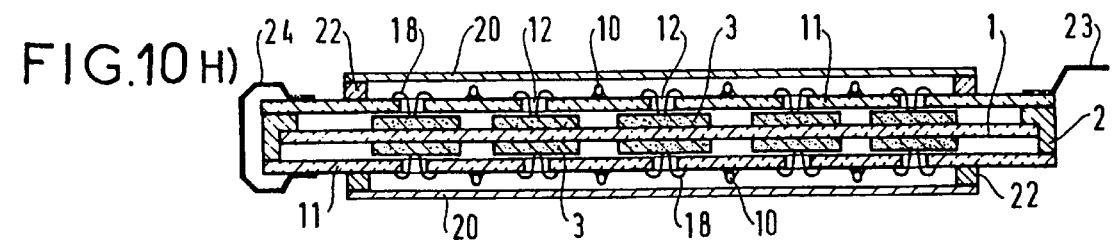

FIG. 10 is used to describe a method in accordance with the invention for manufacturing a high-density, highly reliable integrated circuit assembly up to the stage of enclosing it in a hermetically sealed case and adding external wiring. Variants of this method will suggest themselves to the man skilled in the art, with fewer or more stages, or with the stages performed in a different order, and so on. The invention is characterized only by the stages which relate to the features of a module or assembly according to the invention, as defined above. The prior art stages are described purely by way of non-limiting example.

Referring to FIG. 10, a method of manufacturing an assembly according to the invention further comprises the following steps:

producing a prior art interconnection substrate (11), attaching a frame (22) to said interconnection substrate (see FIG. 10A), attaching a frame (2) to a mechanical support substrate (1) (see FIG. 10C), attaching integrated circuits (3, 4) to said support substrate (1) (see FIG. 10D), attaching interconnection substrates(s) (11) to the frame (s) (2) of the support substrate (1) (see FIG. 10E), microwiring the integrated circuits (3, 4) (see FIG. 10F);

wherein at least some of said microwiring is connected to an interconnection substrate (11) separate from said substrate (1) carrying said integrated circuits (3, 4) (see FIG. 10F).

For the practical implementation of the invention, in a preferred embodiment, further stages as shown in FIG. 10 are used. The preferred method of manufacturing an assembly in accordance with the invention comprises the following stages in addition to the stages already mentioned:

producing an interconnection substrate (11) including apertures (12) (as shown in FIG. 10A), attaching decoupling capacitors (10) to said interconnection substrate (11) between the apertures (12), to minimize spurious coupling between the microwires (18) (see FIG. 10B), microwiring integrated circuits (3, 4), at least some of them through said apertures (12) (see FIG. 10F), attaching at least one hermetically sealed cover (20) to said frame (22) and hermetically sealing it by a prior art method (see FIG. 10G), attaching connecting wires (24) between interconnection substrates (11), if necessary (see FIG. 10H), attaching connecting wires (23) to an interconnection substrate (11) adapted to be connected within electronic equipment in which the device according to the invention is installed (see FIG. 10H).

The method according to the invention can be adapted to all the configurations and implementations mentioned above by way of example and to many other embodiments not explicitly described.

The invention can significantly reduce the vulnerability of such high-density integrated circuit assemblies to the severe environments characteristic of space and military applications and of applications in some sectors of vehicle and mobile electronics. For applications requiring a forecast of reliability prior to their use the assembly according to the invention and the method of the invention have the advantage of using only proven technologies already characterized for these applications. They can be put into use immediately.

We claim:

1. A high-density and highly reliable multiple integrated circuit assembly comprising:

at least one supporting substrate having two substantially parallel sides;

a plurality of integrated circuits disposed on at least one side of said supporting substrate; and a frame comprising one or more parts disposed at the perimeter of said supporting substrate and around said integrated circuits;

said integrated circuits further including interconnection lands connected by microwired connections to circuits printed on a substrate, said assembly further comprising at least one dedicated interconnection substrate having two substantially parallel plane sides, wherein said dedicated interconnection substrate is separate from, opposed by, and parallel to said integrated circuits on said supporting substrate at a distance from said supporting substrate greater than the height of said integrated circuits on said supporting substrate, wherein at least some of said interconnection lands of said integrated circuits are connected to said dedicated interconnection substrate by microwired connections.

2. The assembly according to claim 1, wherein said interconnection substrate include apertures whose size and location provide access to the interconnection lands on the chips through said interconnection substrate.

3. The assembly according to claim 1, wherein said interconnection substrate is a multilevel substrate.

4. The assembly according to claim 1, wherein said interconnection lands are on the perimeter of the chips.

5. The assembly according to claim 1, wherein said interconnection lands are at the center of the chips.

6. The assembly according to claim 1, wherein said interconnection lands are at the center of some of the chips and at the perimeter of others of the chips.

7. The assembly according to claim 1, wherein all the interconnection lands of all the chips are connected by microwired connections to at least one interconnection substrate separate from the supporting substrate carrying the chips.

8. The assembly according to claim 1, wherein some of the input/output interconnection lands are connected to an interconnection substrate separate from the supporting substrate carrying the chips, the remainder being connected to the supporting substrate carrying the chips.

9. The assembly according to claim 1, wherein integrated circuits are mounted on both sides of said supporting substrate mechanically supporting the chips.

10. The assembly according to claim 9, wherein there are two interconnection substrates, one on each side of said supporting substrate.

11. The assembly according to claim 1, wherein said integrated circuits are two-dimensional integrated circuits.

12. The assembly according to claim 1, wherein some of said integrated circuits are three-dimensional integrated circuits.

13. The assembly according to claim 1, wherein all of said integrated circuits are three-dimensional integrated circuits.

14. The assembly according to claim 1, further comprising a stacked plurality of supporting substrates each served by at least one interconnection substrate disposed on at least one side of the supporting substrate.

15. The assembly according to claim 1, wherein said assembly is enclosed in a hermetically sealed case.

16. The assembly according to claim 14, wherein said assembly is in a hermetically sealed case.

17. The assembly according to claim 1 further comprising microwired connections which connect at least some of said interconnection lands of said integrated circuits and said dedicated interconnection substrate, said microwired connections being substantially perpendicular to a corresponding edge of said integrated circuits.

* * * * *